(12) United States Patent
Tamaki et al.

(10) Patent No.: US 9,478,760 B2
(45) Date of Patent: Oct. 25, 2016

(54) SOLID-STATE IMAGING DEVICE, IMAGING MODULE, AND IMAGING APPARATUS

(71) Applicant: Panasonic Intellectual Property Management Co., Ltd., Osaka (JP)

(72) Inventors: Tokuhiko Tamaki, Osaka (JP); Masayuki Takase, Osaka (JP); Yasuhiko Adachi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/668,606

(22) Filed: Mar. 25, 2015

(65) Prior Publication Data

US 2015/0280155 A1 Oct. 1, 2015

(30) Foreign Application Priority Data

Mar. 28, 2014 (JP) .................................. 2014-069441
Oct. 31, 2014 (JP) .................................. 2014-223745

(51) Int. Cl.
*H01L 29/08* (2006.01)
*H01L 51/44* (2006.01)
*H01L 27/30* (2006.01)
*H01L 51/42* (2006.01)

(52) U.S. Cl.
CPC ........... *H01L 51/441* (2013.01); *H01L 27/307* (2013.01); *H01L 51/4273* (2013.01); *Y02E 10/549* (2013.01)

(58) Field of Classification Search
CPC ........................... H01L 27/307; H01L 51/441
USPC ........................................................ 257/40
See application file for complete search history.

(56) References Cited

U.S. PATENT DOCUMENTS

| 2008/0246107 | A1 | 10/2008 | Maehara |
| 2013/0075744 | A1* | 3/2013 | Shiobara ............. H01L 51/5284 257/72 |
| 2014/0027792 | A1* | 1/2014 | Iwasaki .................. H01L 33/08 257/88 |
| 2014/0117486 | A1 | 5/2014 | Doi et al. |

FOREIGN PATENT DOCUMENTS

| JP | 2008-112907 | 5/2008 | |
| JP | 2008-252004 | 10/2008 | |
| JP | 2012-238774 | 12/2012 | |
| JP | WO2013001809 A1 * | 3/2013 | ........... H01L 27/146 |
| WO | 2012/157730 | 11/2012 | |
| WO | 2013/001809 | 1/2013 | |

* cited by examiner

*Primary Examiner* — Matthew Gordon
(74) *Attorney, Agent, or Firm* — McDermott Will & Emery LLP

(57) ABSTRACT

A solid-state imaging device according to an aspect of the present disclosure includes pixel including: a first and second electrode located in a same layer, the second electrode being located between the first electrode and the other first electrodes included in adjacent pixels; an organic photoelectric conversion film including a first surface and a second surface, the first surface being in contact with the first electrode and the second electrode; and a counter electrode located on the second surface. The organic photoelectric conversion film extends over the pixels. The first electrode is an electrode through which electrons or holes generated in the organic photoelectric conversion film are extracted. An area ratio of the first electrode to the each pixel is 25% or less. And a total area ratio of a sum of the first electrode and the second electrode to the each pixel is 40% or greater.

13 Claims, 18 Drawing Sheets

SOLID-STATE IMAGING DEVICE, IMAGING MODULE, AND IMAGING APPARATUS

CROSS REFERENCES TO RELATED APPLICATIONS

This Application claims priority to Japanese Patent Application No. 2014-069441, filed on Mar. 28 2014, and Japanese Patent Application No. 2014-223745, filed on Oct. 31 2014, the contents of which are hereby incorporated by reference.

BACKGROUND

1. Technical Field

The present disclosure relates to a solid-state imaging device, an imaging module, and an imaging apparatus.

2. Description of the Related Art

FIG. 16 is a cross-sectional view illustrating a pixel array portion of a solid-state imaging device which uses an organic photoelectric conversion film. In a semiconductor substrate, electric charge storage portions 102 and signal readout portions 103 are formed. On the semiconductor substrate, an insulating film 104 is formed. Plugs 105 which are connected to the electric charge storage portions 102 are formed penetrating the insulating film 104. On the insulating film 104, lower electrodes 106 which correspond to the electric charge storage portions 102 and are connected to the plugs 105 are formed. An organic photoelectric conversion film 107, an upper electrode 108, and a passivation film 109 are formed on the lower electrodes 106. On the passivation film 109, a red color filter 110R, a green color filter 110G, and a blue color filter 110B are formed, corresponding to the lower electrodes 106. On the color filters 110R, 110G, and 110B, microlenses 111 are formed, corresponding to the color filters. Such a solid-state imaging device is disclosed in, for example, Japanese Unexamined Patent Application Publication No. 2008-252004.

SUMMARY

One non-limiting and exemplary embodiment provides a solid-state imaging device, an imaging module, and an imaging apparatus in which peeling of the organic photoelectric conversion film is suppressed.

In one general aspect, the techniques disclosed here feature a solid-state imaging device, including pixels arranged two-dimensionally, each pixel of the pixels including: a first electrode; a second electrode located in a same layer as the first electrode, the second electrode being located such that the first electrode included in one of the pixels is caused to be separated from the first electrode included in each of the pixels adjacent to the one of the pixels; an organic photoelectric conversion film including a first surface and a second surface, the first surface being opposite to the second surface, the first surface being in contact with the first electrode and the second electrode; and a counter electrode located on the second surface. The organic photoelectric conversion film extends over the pixels. The first electrode is an electrode through which electrons or holes generated in the organic photoelectric conversion film are extracted. An area ratio of the first electrode to the each pixel is 25% or less. And a total area ratio of a sum of the first electrode and the second electrode to the each pixel is 40% or greater.

It should be noted that general or specific embodiments may be implemented as an electronic device, a system, a method, or any selective combination of a solid-state imaging device, an electronic device, a system and a method.

Using the solid-state imaging device, the imaging module, and the imaging apparatus of the present disclosure makes it possible to reduce peeling of the organic photoelectric conversion film, which leads to an improvement in reliability.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Underlying Knowledge Forming Basis of the Present Disclosure)

In relation to the solid-state imaging device including an organic photoelectric conversion film on the surface layer side of the solid-state imaging device described in the "Description of the Related Art" section, the inventors have found the following two items of knowledge.

Figure 17:
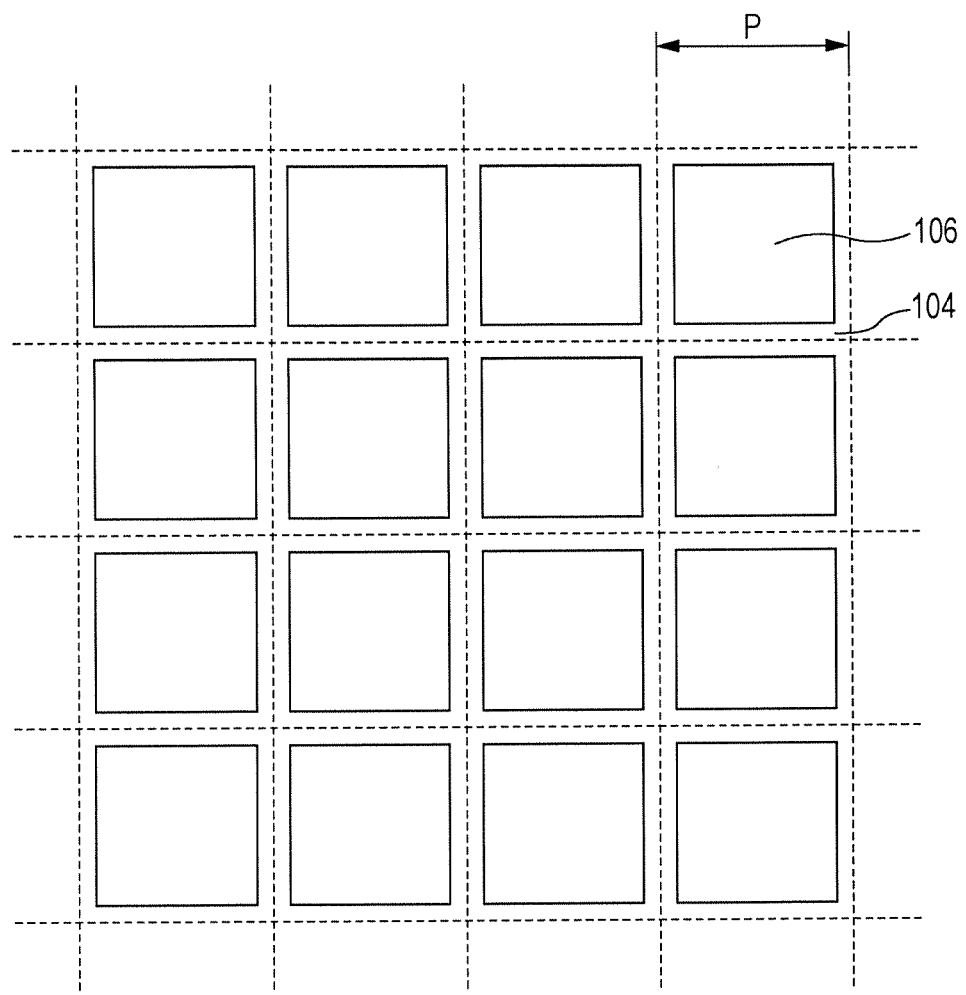
FIG. 17 is a diagram illustrating a lower electrode layout of a first layered-type solid-state imaging device according to the related art.
Figure 18:
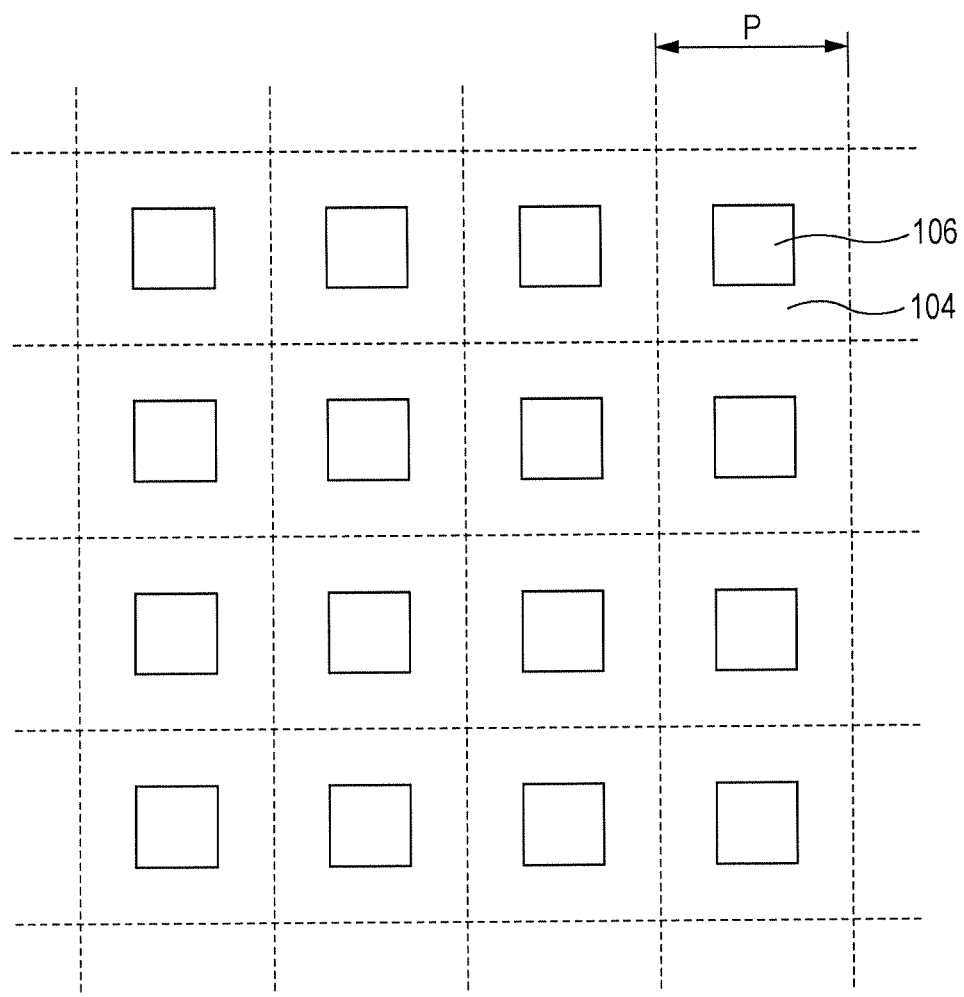
FIG. 18 is a diagram illustrating a lower electrode layout of a second layered-type solid-state imaging device according to the related art.

The first knowledge is knowledge that setting an aperture ratio large is not suitable for the super resolution technology. In this description, the aperture ratio refers to an area ratio of the first electrode in a pixel. The super resolution technology refers to a technology to generate a high resolution image by interpolating between pixels by use of a plurality of low resolution images. In the super resolution technology, a portion missing from a low resolution image is interpolated by use of other images. However, as illustrated in FIG. 17, when the aperture ratio is close to 1, a portion missing from a low resolution image is significantly small. In consequence, it becomes difficult to obtain a high resolution image by interpolation by use of other images. As thus described, setting the aperture ratio at close to 1 is not suitable for the super resolution technology. Therefore, when the super resolution technology is used, for example, it is desirable to set the aperture ratio small as illustrated in FIG. 18.

Even in a case in which the super resolution technology is not used but, for example, imaging with low sensitivity is required in an environment where the intensity of light is too high, it is also desirable to set the aperture ratio small.

The second knowledge is knowledge that, when the aperture ratio is set at a small value, an organic photoelectric conversion film becomes liable to peel. Peeling of an organic photoelectric conversion film is likely to take place in the manufacturing process of a solid-state imaging device. Specifically, peeling of an organic photoelectric conversion film is likely to take place in, for example, a heating step in which an upper electrode is formed on the organic photoelectric conversion film, a heating step in which a passivation film, formed on the upper electrode, is formed, and a peeling step in which a piece of tape pasted before a wafer is diced is peeled after dicing.

The reason for an organic photoelectric conversion film becoming liable to peel when the aperture ratio is set at a small value is supposed to be that an organic photoelectric conversion film has a high adhesiveness to a metallic material and a low adhesiveness to an insulating film.

The above-described first knowledge and second knowledge are in a tradeoff relation. In other words, when the aperture ratio is made small in order to use the super resolution technology, the organic photoelectric conversion film becomes liable to peel. Conversely, when the aperture ratio is made large in order to reduce peeling of the organic photoelectric conversion film, the device becomes unsuitable for the super resolution technology. The inventors have found such new problems and investigated solutions thereof.

An embodiment to solve these problems will be described specifically below with reference to the accompanying drawings.

The embodiment described below is intended to illustrate a general or specific example. Numerical values, shapes, materials, components, arrangement positions and connection configurations of the components, steps, an order of the steps, and the like, which are illustrated in the following embodiment, are an example and not intended to limit claims. Among components described in the embodiment below, those not recited in the independent claims expressing the most generic concept will be described as arbitrary components.

Embodiment

A solid-state imaging device according to an embodiment of the present disclosure will be described below with reference to the accompanying drawings.

[Configuration of Solid-State Imaging Device]

Figure 1:
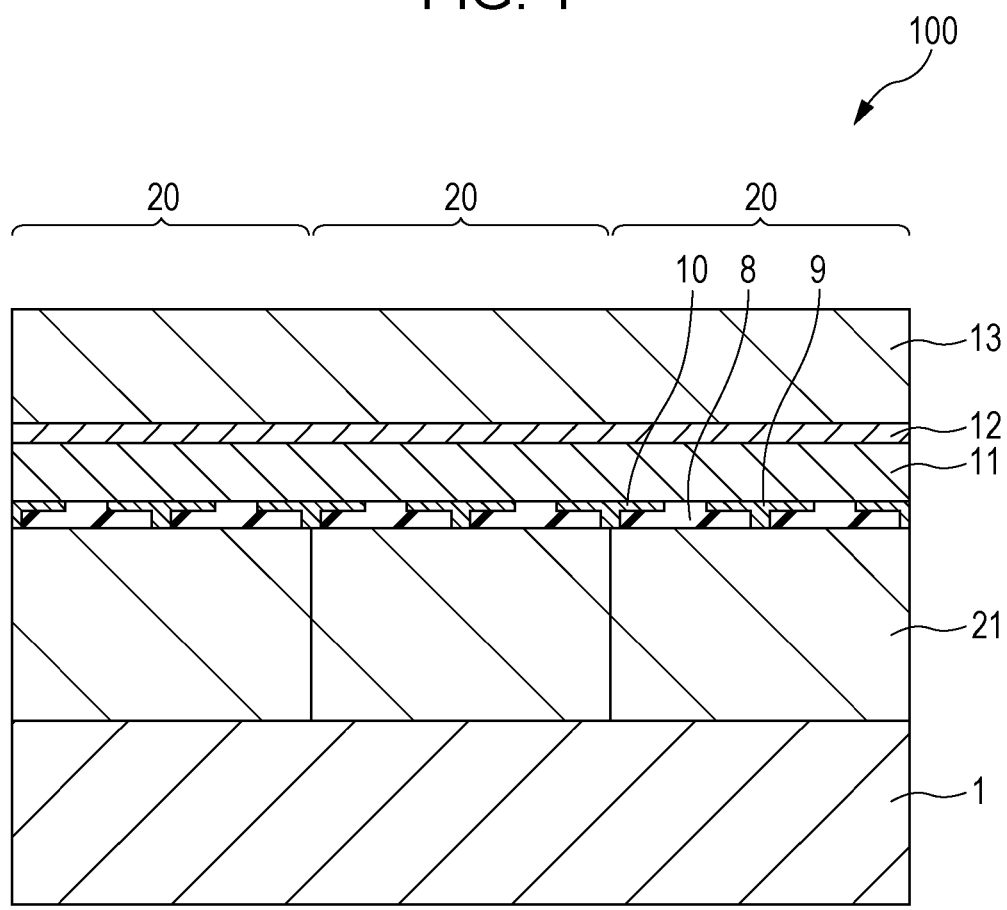
FIG. 1 is a schematic cross-sectional view illustrating a configuration example of a solid-state imaging device according to an embodiment.

FIG. 1 is a schematic cross-sectional view illustrating a configuration example of a solid-state imaging device according to the embodiment. As illustrated in FIG. 1, a solid-state imaging device 100 includes a silicon substrate 1, readout circuits 21, an organic photoelectric conversion film 11, an interlayer insulating film 8, first electrodes 9, second electrodes 10, an upper electrode 12 (also referred to as a counter electrode), and a passivation film 13. FIG. 1 illustrates a cross section of three pixels 20. The readout circuits 21 and the first electrodes 9 are arranged corresponding to the pixels on a one-to-one basis.

The silicon substrate 1 is, for example, a p-type silicon substrate.

The readout circuits 21 are formed on the silicon substrate 1 by use of a semiconductor process. Each readout circuit 21 reads out a pixel signal corresponding to electrons or holes extracted through the first electrode 9 of the pixel the readout circuit 21 belongs to.

The organic photoelectric conversion film 11 includes at least an organic photoelectric conversion layer. The organic photoelectric conversion layer includes a photoelectric conversion material which generates electric charges in accordance with received light. The organic photoelectric conversion film 11 is arranged on the interlayer insulating film 8 and the plurality of first electrodes 9 and second electrodes 10, covering them. In other words, the organic photoelectric conversion film 11 is formed extending over the plurality of pixels 20.

Though the organic photoelectric conversion film 11 has a constant film thickness over the first electrode 9, the film thickness may vary at a position other than the pixels 20 (that is, outside an effective pixel region). The organic photoelectric conversion film 11 is not limited to a layer made of only an organic material. The organic photoelectric conversion film 11 may, for example, include a layer containing an inorganic material at least in a portion thereof.

The interlayer insulating film 8 is formed with, for example, a silicon oxide or a silicon nitride and insulates the first electrode 9, the second electrode 10, and so on.

The first electrodes 9 are electrodes to extract electrons or holes which are generated in the organic photoelectric conversion film 11 and formed in a square shape. Electrons or holes extracted from the first electrode 9 are stored in a storage capacitor in the readout circuit 21 by the readout circuit 21. In this embodiment, the area ratio of the first electrode 9 in the pixel 20 may be 25% or less. Setting the area ratio of the first electrode 9 at 25% or less makes it possible to apply a super resolution technology, which will be described later, easily. Hereinafter, electrons or holes will be collectively referred to as electric charges. For a material of the first electrode 9, it is desirable to use a material the work function value of which is in a good relation with the work function value of an electron blocking layer 11a or a hole blocking layer 11c, which will be described later. Specifically, for the material of the first electrode 9, it is desirable to use, for example, a high melting point metal such as Ti, TiN, Ta, and Mo or a compound thereof.

The second electrodes 10 are formed with the same material and by the same process as the first electrodes 9. The second electrode 10 is an electrode to adjust the area ratio of electrodes in the pixel 20 and not connected to the storage capacitor in the readout circuit 21. In other words, the second electrode 10 is a dummy electrode to adjust the area ratio of electrodes and has a function differing from a function of the first electrode 9.

The total area ratio (hereinafter, also referred to as a metal area ratio) of the first electrode 9 and the second electrode 10 in the pixel 20 may be 40% or greater. Setting the metal area ratio at 40% or greater makes it possible to reduce peeling of the organic photoelectric conversion film 11.

The upper electrode 12 is an electrode countering the first electrodes 9 and formed on the organic photoelectric conversion film 11. For a material of the upper electrode 12, a conductive material with translucency (for example, indium tin oxide: ITO) may be used in order to make light enter the organic photoelectric conversion film 11.

The passivation film 13 is formed on the upper electrode 12. A positive bias voltage is applied to the upper electrode 12. Incidence of light causes electron-hole pairs to be generated in the organic photoelectric conversion film 11, and holes above the first electrode 9 move to the first electrodes 9. Holes extracted through the first electrodes 9 are stored in the storage capacitor in the readout circuit 21.

Figure 2:
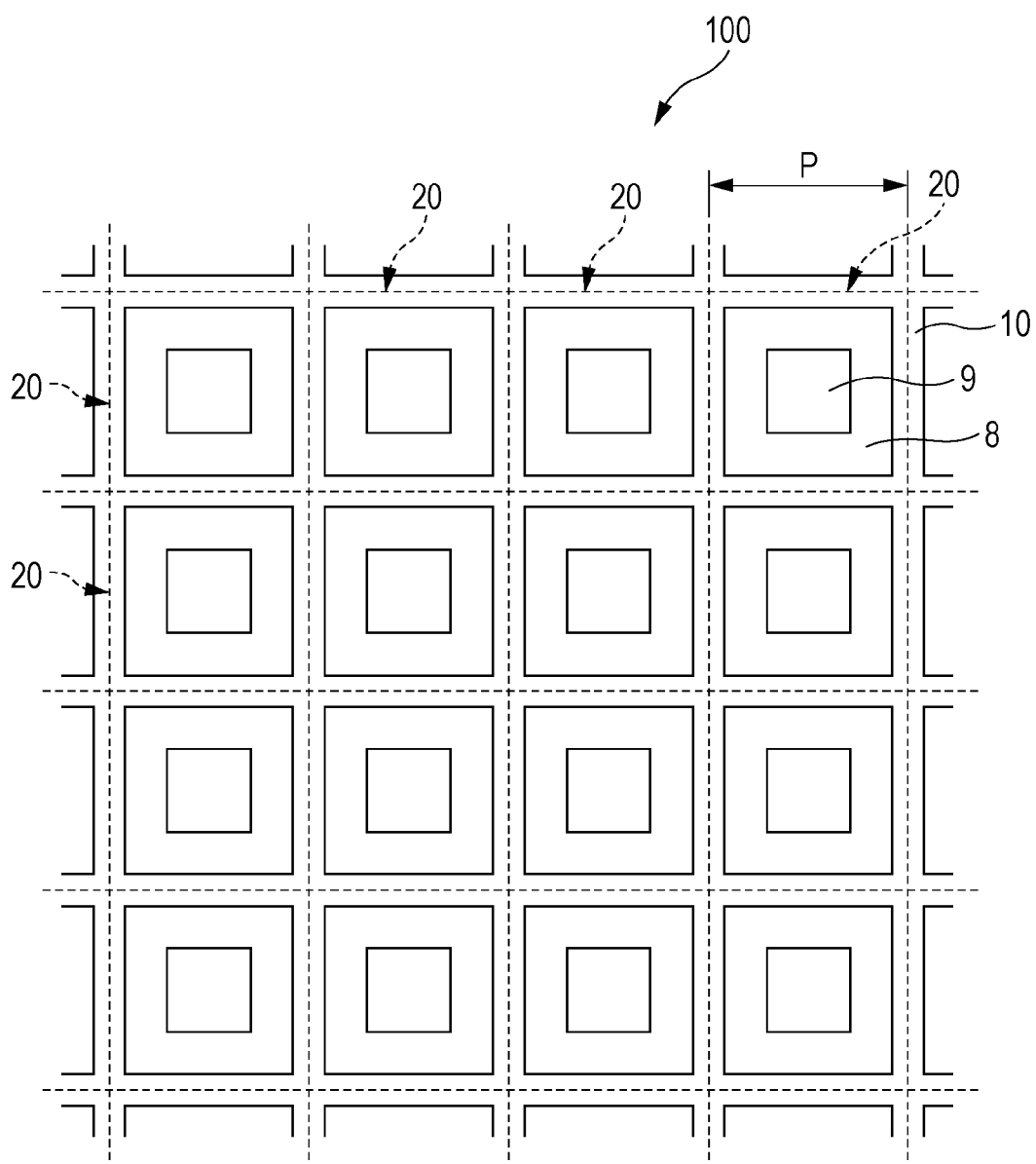
FIG. 2 is a plan view illustrating an example of a layout of electrodes in a base on which an organic photoelectric conversion film is deposited in the solid-state imaging device according to the embodiment.

FIG. 2 is a plan view illustrating an example of a layout of electrodes in a base on which the organic photoelectric conversion film 11 is deposited. The second electrodes 10 compose a substantially square grid. Each first electrode 9 is arranged at the center of each aperture shaped by the second electrodes 10. In other words, the second electrodes 10 are arranged so as to surround each first electrode 9. Center lines of linear portions of the second electrodes 10 define the pixels 20, and an area surrounded by these center lines corresponds to a pixel 20 (even when the second electrodes 10 are not formed, the pixels 20 are defined by lines dividing spaces between adjacent first electrodes 9 in half). In the configuration example illustrated in FIG. 2, a pixel pitch P of the pixels 20 is 0.9 μm. In the above description, the pixel pitch indicates an interval between the center lines of the linear portions of the second electrodes 10 in FIG. 2. In the base on which the organic photoelectric conversion film 11 is deposited, the interlayer insulating film 8, the first electrodes 9, and the second electrodes 10 are arranged. The organic photoelectric conversion film 11 is arranged contacting these elements. In order to apply the super resolution technology, lengths of the first electrode 9 in both the vertical direction and the horizontal direction are set at, for example, 0.45 μm, which is half the width of the pixel pitch P. The first electrode 9 has an area ratio of 25% or less in the pixel 20. The total area ratio of the first electrode 9 and the second electrode 10 in the pixel 20 is 40% or greater. This is to reduce or prevent peeling of the organic photoelectric conversion film 11.

Figure 3:
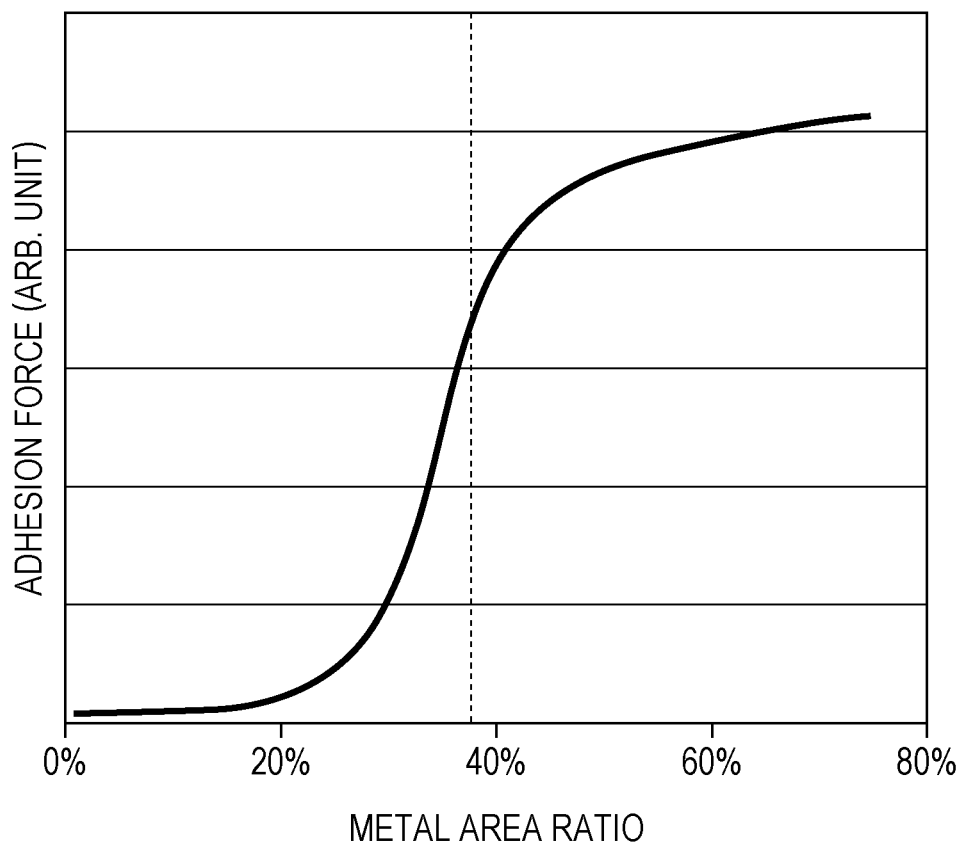
FIG. 3 is a characteristic diagram illustrating a relation between an area ratio of the electrodes in a pixel and adhesion force between the organic photoelectric conversion film and the base.

FIG. 3 is a characteristic diagram illustrating a relation between the area ratio of the electrodes and adhesion force between the organic photoelectric conversion film 11 and the base.

In FIG. 3, the horizontal axis indicates the total area ratio (also referred to as a metal area ratio) of the first electrodes 9 and the second electrodes 10 in the pixels 20. The vertical axis indicates results of measurement of the adhesion force through a tape test (a peel test by use of tape). Arbitrary unit may be set to the unit of the vertical axis.

As illustrated by the tape test results in FIG. 3, the adhesion force is substantially weak in a range with a metal area ratio of 25% or less and significantly improves in a range with the metal area ratio of 40% or greater. Consequently, when the metal area ratio is set at 25% or less where the adhesion force is weak, peeling of the organic photoelectric conversion film 11 may take place in a passivation film forming step and a wafer dicing step, which are following steps after the photoelectric conversion film is deposited. On the other hand, when the metal area ratio is set at 40% or greater where the adhesion force is strong, even in the passivation film forming step and the wafer dicing step, which are following steps after the photoelectric conversion film is deposited, peeling of the organic photoelectric conversion film 11 does not take place.

This is supposed to be caused by the fact that, though adhesiveness between materials is determined by mechanical bonding strength, chemical bonding strength, and intermolecular force, an organic film has a high adhesiveness to metallic materials and a low adhesiveness to insulating materials.

In the embodiment of the present disclosure, setting the area of the first electrode 9, through which electric charges are extracted, at a small value produces a configuration appropriate for the super resolution technology. At the same time, a configuration in which, by forming the second electrodes apart from the first electrodes 9, the total area ratio of the first electrode 9 and the second electrode 10 in the pixel 20 is made not so small to cause the organic photoelectric conversion film 11 to peel is used. In other words, first, to use the super resolution technology effectively, the area ratio of the first electrode 9 in a pixel is set at 25% or less. Second, to reduce or prevent peeling of the organic photoelectric conversion film 11, the total area ratio of the first electrode 9 and the second electrode 10 in a pixel is set at 40% or greater.

[Variation of Base of Organic Photoelectric Conversion Film 11]

Figure 4:
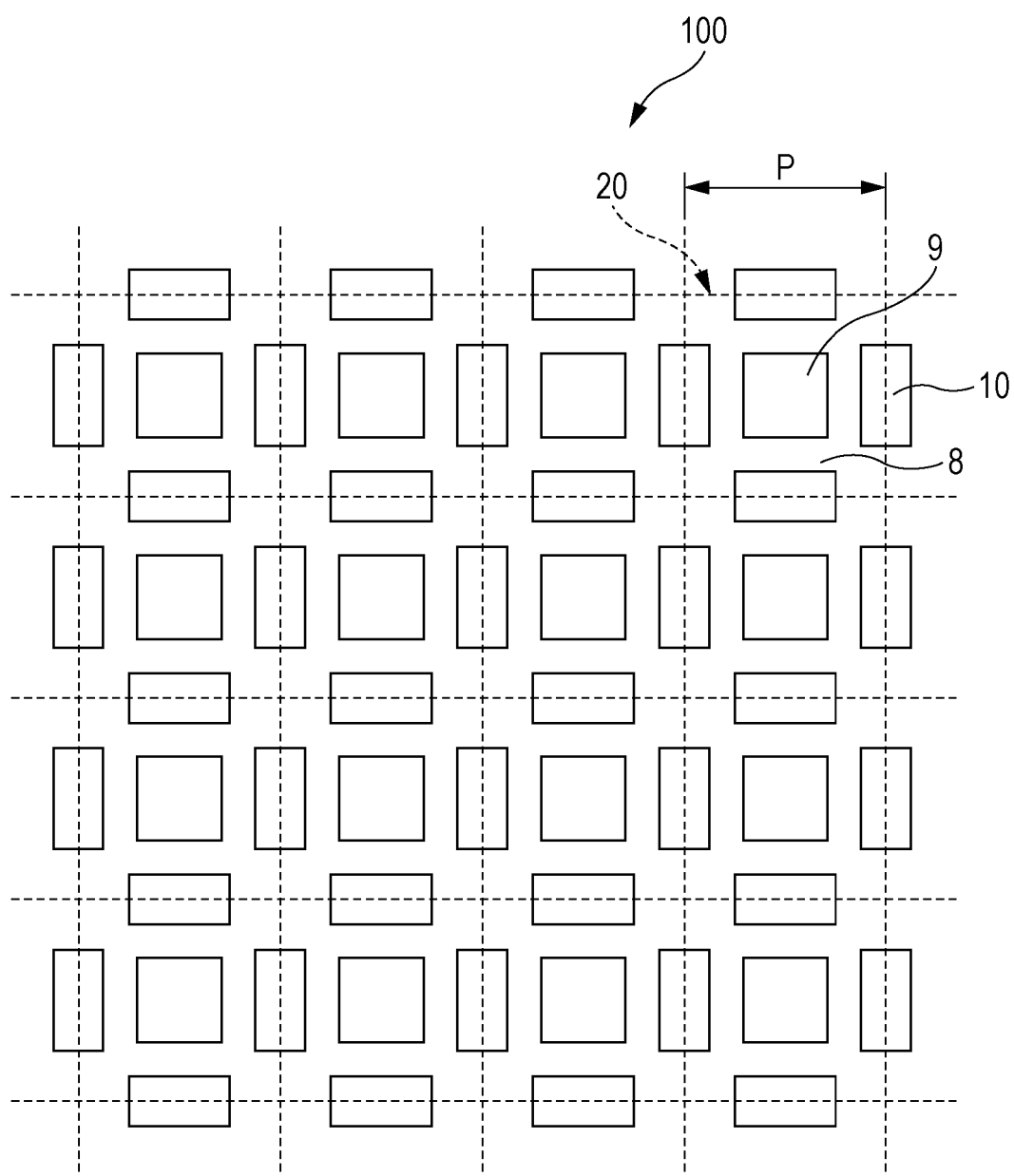
FIG. 4 is a plan view illustrating another example of the layout of the electrodes in the base on which the organic photoelectric conversion material is deposited in the solid-state imaging device according to the embodiment.

FIG. 4 is a plan view illustrating another example of the layout of the electrodes in the base of the organic photoelectric conversion film 11. In FIG. 4, the second electrodes 10 are formed of a plurality of electrodes insulated from one another and discretely arranged surrounding the first electrodes 9. However, the total area ratio of the first electrode 9 and the second electrodes 10 in the pixel 20 is set at 40% or greater. The area ratio of the first electrode 9 in the pixel 20 is set at 25% or less. With this configuration, it is possible not only to reduce or prevent peeling of the organic photoelectric conversion film 11 but also to apply the super resolution technology effectively.

Next, a configuration example of the organic photoelectric conversion film 11 will be described.

Figure 5A:
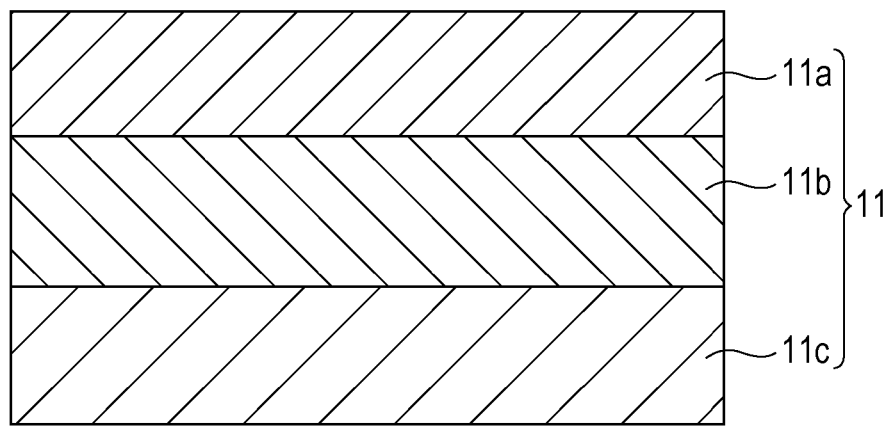
FIG. 5A is a cross-sectional view illustrating a configuration example of the organic photoelectric conversion film according to the embodiment.
Figure 5B:
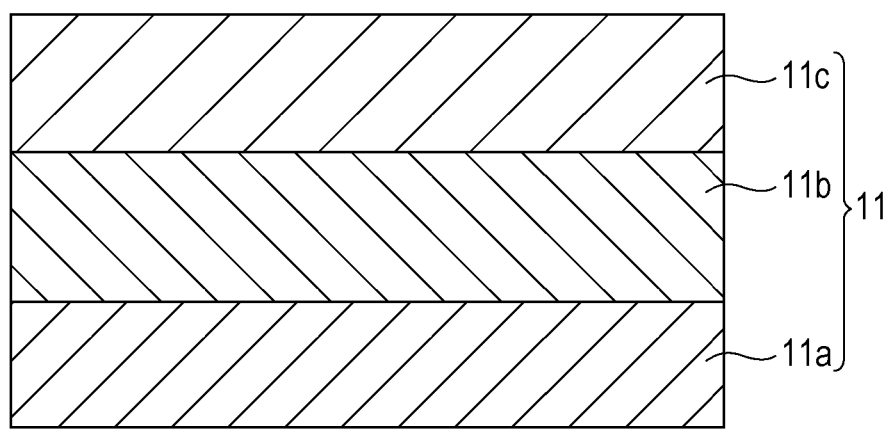
FIG. 5B is a cross-sectional view illustrating another configuration example of the organic photoelectric conversion film according to the embodiment.

FIG. 5A is a cross-sectional view illustrating a configuration example of an organic photoelectric conversion film. FIG. 5B is a cross-sectional view illustrating another configuration example of the organic photoelectric conversion film.

As illustrated in FIGS. 5A and 5B, the organic photoelectric conversion film 11 includes an electron blocking layer 11a, an organic photoelectric conversion layer 11b, and a hole blocking layer 11c. The order of layering in FIG. 5A and the order of layering in FIG. 5B are reversed. The order of layering depends on whether, among hole-electron pairs generated by photoelectric conversion in the organic photoelectric conversion layer 11b, electric charges extracted through the first electrodes 9 are electrons or holes. In the organic photoelectric conversion film 11, layering the electron blocking layer 11a or the hole blocking layer 11c on the side toward the upper electrode 12 may be omitted.

The electron blocking layer 11a contains an electron donating organic material. For the electron blocking layer 11a, for example, an aromatic diamine compound, a porphyrin compound, a triazole derivative, an oxadiazole derivative, an imidazole derivative, a polyarylalkane derivative, a pyrazoline derivative, a pyrazolone derivative, a phenylenediamine derivative, a anylamine derivative, an amino-substituted chalcone derivative, an oxazole derivative, a styrylanthracene derivative, a fluorenone derivative, a hydrazone derivative, a silazane derivative, and so on may be used.

The hole blocking layer 11c contains an electron accepting material. For the hole blocking layer 11c, for example, fullerenes including an organic C60 and C70, derivatives thereof, or the like may be used.

The organic photoelectric conversion layer 11b may be a layer formed by mutually dispersing and mixing an organic p-type semiconductor and an organic n-type semiconductor (bulk heterojunction structure).

[Configuration of Imaging Module]

Next, an imaging module which uses the above-described solid-state imaging device 100 will be described.

Figure 6:
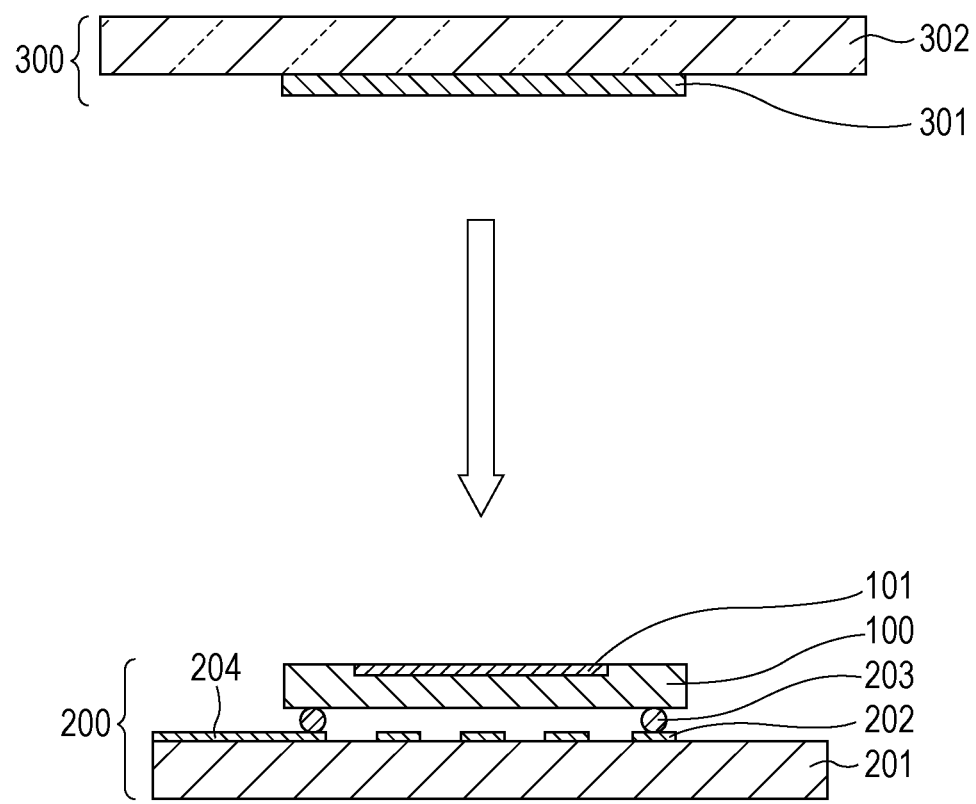
FIG. 6 is a cross-sectional view illustrating a configuration example of an electronic preparation using an imaging module according to the embodiment.

FIG. 6 is a cross-sectional view illustrating a configuration example of an electronic preparation using an imaging module 200 according to the embodiment.

The imaging module 200 includes a solid-state imaging device 100 and a base material 201 (for example, plastic package). The solid-state imaging device 100 is soldered to a wiring 202 and a connection wiring 204 on the base material 201 by solder balls 203. The solid-state imaging device 100 has an imaging surface 101 for receiving light.

This imaging module 200 is used for, for example, medical direct imaging. Onto the imaging surface 101 of the imaging module 200, the sample piece 300 is pressed. Therefore, the imaging module 200 with the sample piece 300 is referred to as an electronic preparation.

The sample piece 300 includes a sample 301, and a glass slide 302, to which the sample 301 is attached. The sample 301 is, for example, a pathological sample or the like, and is, for example, sliced to a piece with a thickness of about 4 μm and attached to the glass slide 302.

[Configuration of Imaging System]

Next, an imaging apparatus which uses the above-described imaging module and an imaging system will be described.

Figure 7:
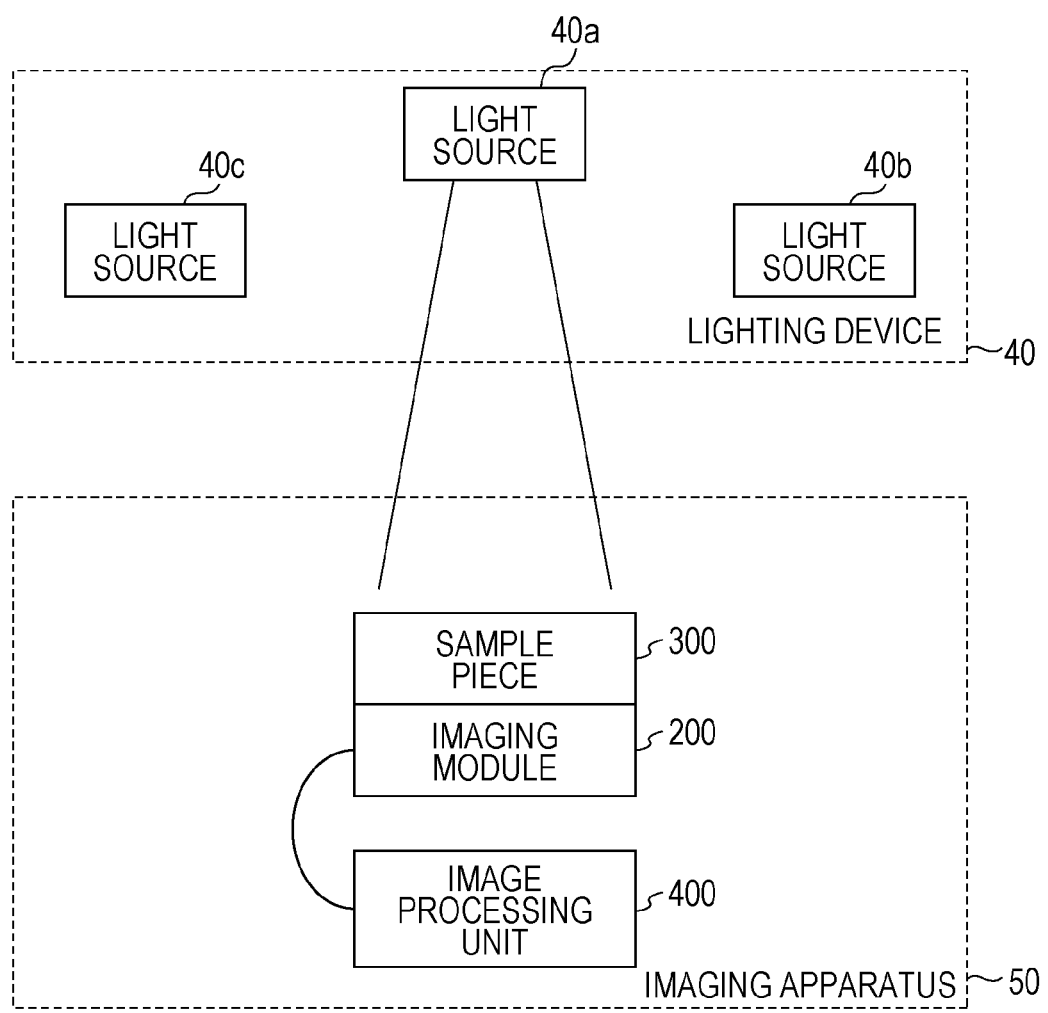
FIG. 7 is a block diagram illustrating a configuration example of an imaging system according to the embodiment.

FIG. 7 is a block diagram illustrating a configuration example of an imaging system according to the embodiment.

The imaging system illustrated in FIG. 7 includes a lighting device 40 and an imaging apparatus 50. In FIG. 7, the lighting device 40 includes a plurality of light sources 40a, 40b, and 40c. The imaging apparatus 50 includes an imaging module 200 and an image processing unit 400. A plurality of images the incidence angles of which are different from one another are imaged by radiating rays of light with different incidence angles to the sample piece 300. Then, by using the plurality of imaged images, a high resolution image is obtained.

The plurality of light sources 40a, 40b, and 40c alternatively radiate rays of light with incidence angles differing from each other to the sample piece 300. The rays of light, each of which is radiated by each of the light sources 40a, 40b, and 40c, have the same characteristic and may be, for example, white visible light. Alternatively, the light may be light with a specific wavelength which penetrates a specific region of the sample or light with a specific wavelength which does not penetrate the specific region of the sample.

The imaging module 200 may be an imaging module described as a configuration example in FIG. 6. Although, in FIG. 7, an example in which the lighting device 40 includes three light sources 40a, 40b, and 40c is illustrated, the number of light sources may be the same as the number of images used in the super resolution technology.

The image processing unit 400 obtains a high resolution image by using a plurality of images, imaged by the imaging module 200 with rays of illuminating light with incidence angles differing from one another.

[Operation of Imaging System]

An operation example of the imaging system configured as described above will be described below. In the following description, an operation example for a case in which the imaging system illustrated in FIG. 7, by imaging four images (low resolution images), obtains an image (high resolution image) with quadruple resolution will be described.

Two low resolution images among the four low resolution images will be described referring to FIGS. 8A to 9C.

Figure 8A:
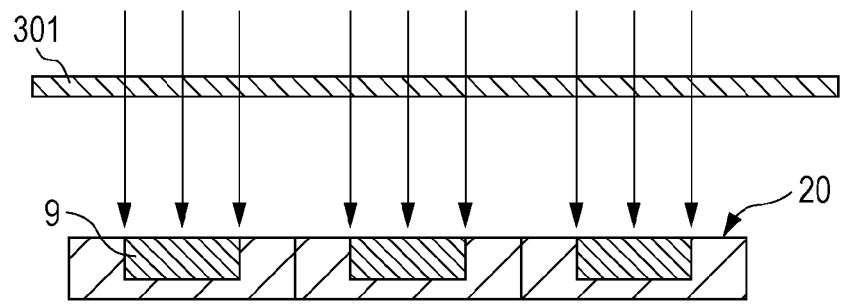
FIGS. 8A to 8C are explanatory diagrams illustrating an imaging example of the imaging system according to the embodiment.
Figure 8B:
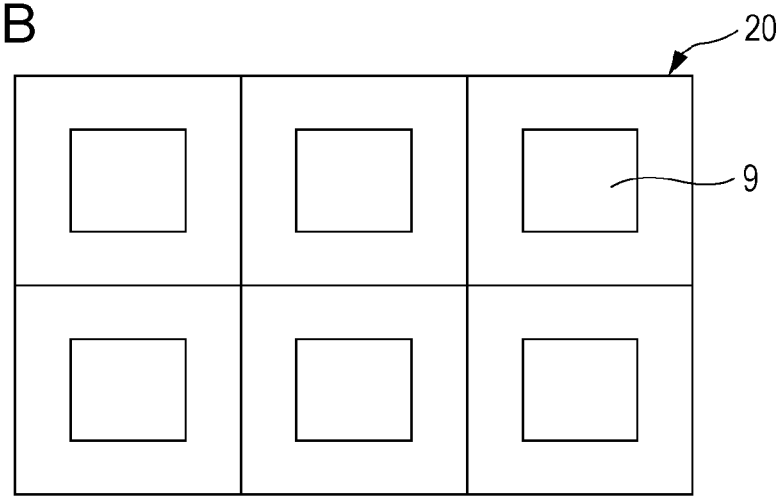
Figure 8C:
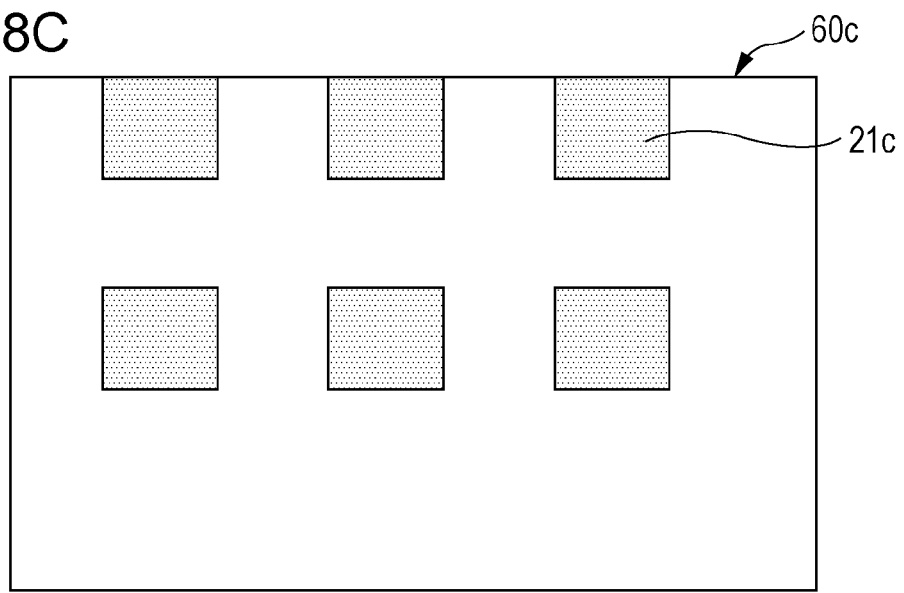

FIGS. 8A to 8C are explanatory diagrams illustrating an example of imaging of the first low resolution image in the imaging system according to the embodiment.

FIG. 8A is a cross-sectional view schematically illustrating incidence of light, which has been transmitted through the sample 301, into each pixel 20. To the sample 301, the light is perpendicularly radiated from a light source. FIG. 8B is a plan view schematically illustrating six pixels 20, to which attention is paid, and the first electrodes 9 of the individual pixels. FIG. 8C is a diagram schematically illustrating image information, which is obtained from the six pixels 20, of the sample 301. A low resolution image 60c is composed of individual pieces of pixel information 21c. Each piece of pixel information 21c indicates image information of a portion of the sample 301 where light, which is actually used in imaging, is transmitted. In the above description, the light actually used in imaging means light radiated to regions where electric charges can be extracted through the first electrodes in the organic photoelectric conversion film 11.

Figure 9A:
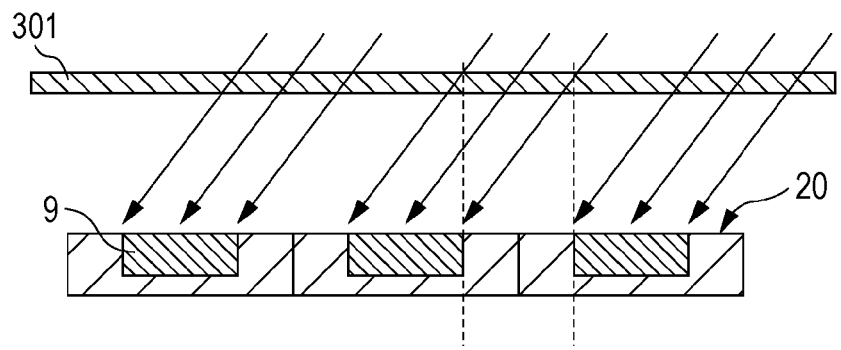
FIGS. 9A to 9C are explanatory diagrams illustrating another imaging example of the imaging system according to the embodiment.
Figure 9B:
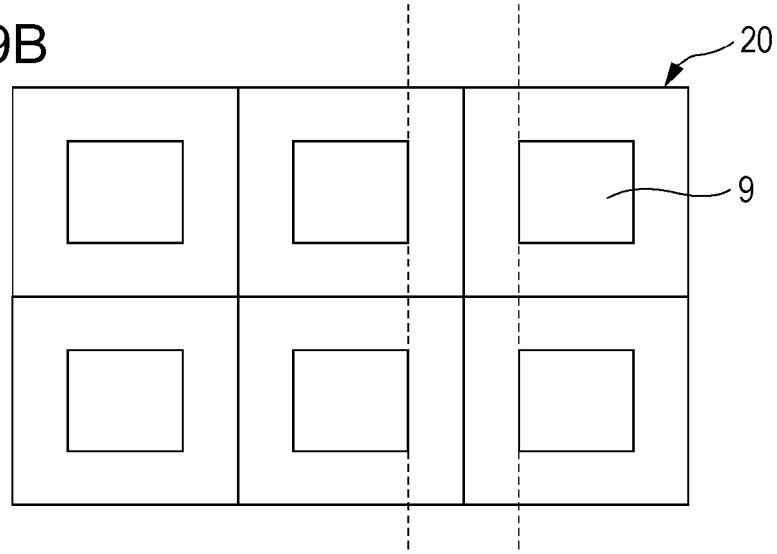
Figure 9C:
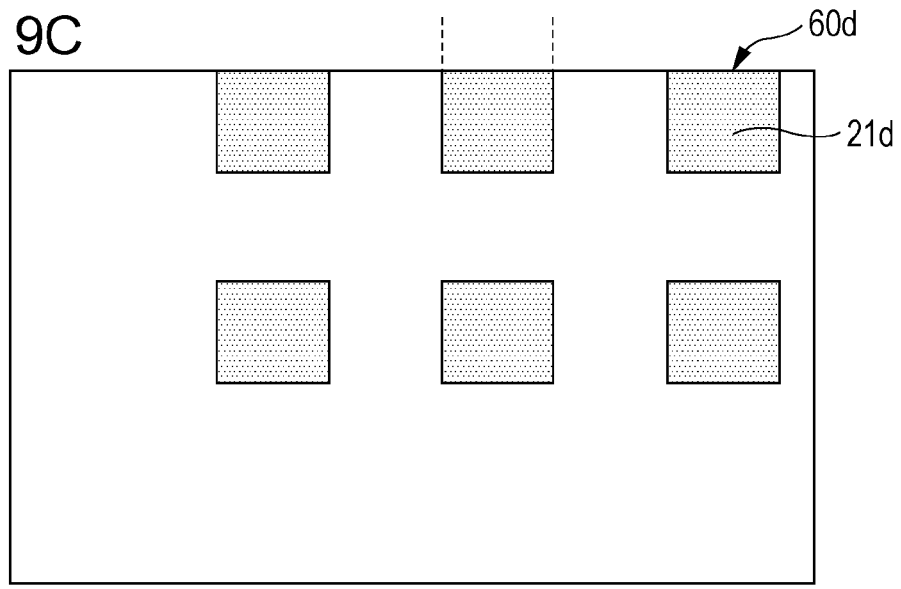

FIGS. 9A to 9C are explanatory diagrams illustrating an example of imaging of the second low resolution image in the imaging system according to the embodiment. In FIGS. 9A to 9C, the incidence direction of light, which is incident on the sample 301, is different from the case in FIGS. 8A to 8C. As a result, the positions of individual pieces of pixel information 21d in a low resolution image 60d are different from the positions of equivalent pieces of pixel information in FIG. 8C. In FIG. 9C, each piece of pixel information 21d indicates image information of a portion of the sample 301 where light, which is actually used in imaging, is transmitted. Therefore, the pixel information 21d in FIG. 9C and the pixel information 21c in FIG. 8C indicate image information of different portions of the sample 301. In other words, the low resolution image 60d in FIG. 9C contains image information missing from the low resolution image 60c in FIG. 8C.

As described referring to FIGS. 8A to 9C, by switching light sources of the imaging system and radiating rays of light with different incidence angles, a plurality of images are imaged. With this configuration, it is possible to obtain a plurality of images which mutually supply image information between pixels lacking in other images on the level of pixels. By using the plurality of images described above, it is possible to obtain an image with higher resolution.

Figure 10:
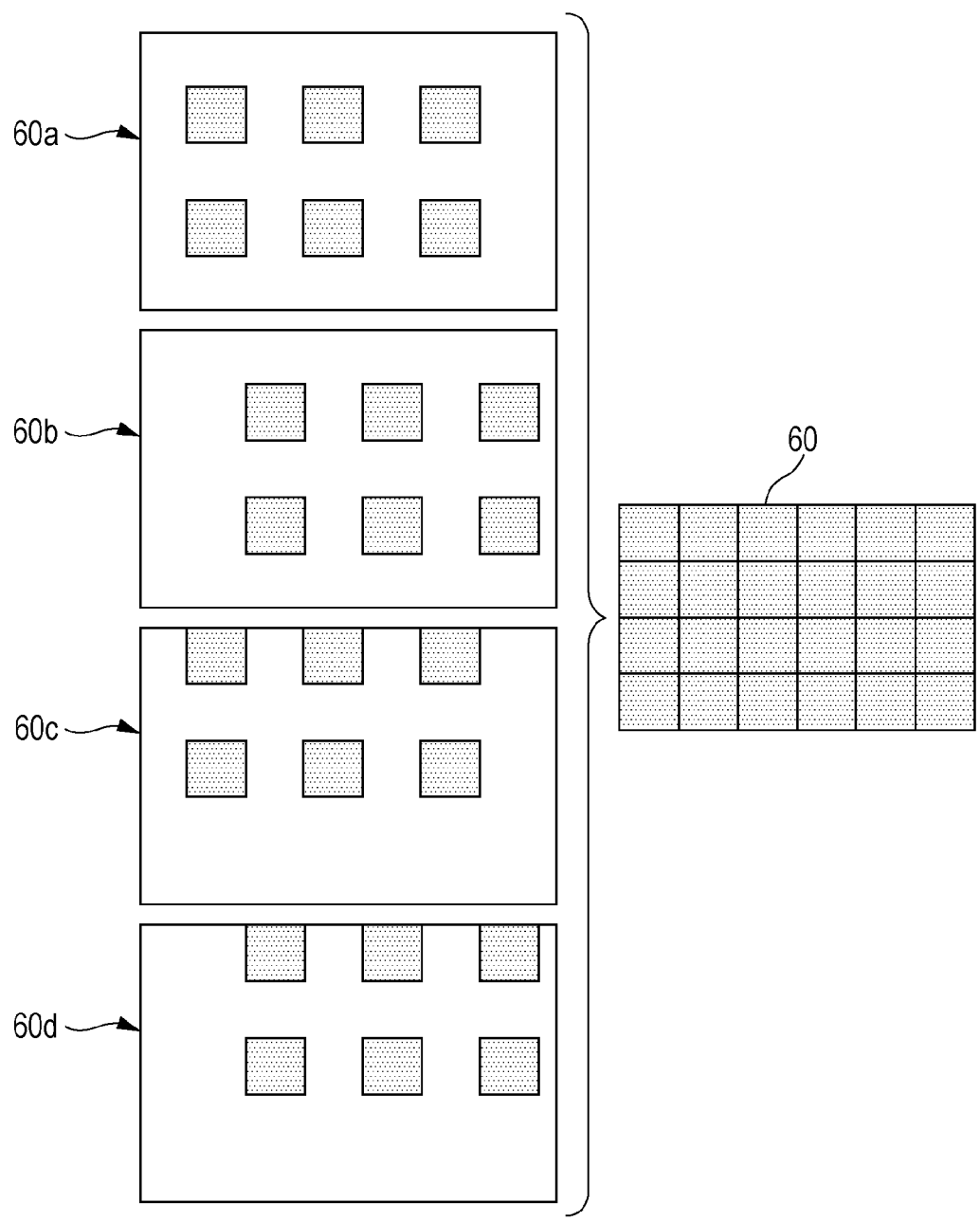
FIG. 10 is an explanatory diagram illustrating an example of achieving high resolution by the imaging system according to the embodiment.

FIG. 10 is an explanatory diagram illustrating an example of a method to obtain a high resolution image in the imaging system according to the embodiment. In FIG. 10, images 60a to 60d are images of the sample 301 imaged by radiating rays of light with four incidence angles differing from one another. The images 60c and 60d are the images illustrated in FIGS. 8C and 9C, respectively. The images 60a and 60b are images imaged by radiating rays of light with incidence angles differing from the incidence angles of the images 60c and 60d.

Four images 60a to 60d are, as illustrated in FIG. 10, images of an identical portion of the sample 301 on the level of images. However, on the level of pixels, the images 60a to 60d are images of portions differing from one another. The image processing unit 400 generates a high resolution image 60 by mutually interpolating between pixels by use of such images 60a to 60d.

In the example illustrated in FIGS. 8A to 10, the area ratio of the first electrode in the pixel is set at 25%. In this embodiment, it is supposed that resolution is increased twice both in the vertical direction and in the horizontal direction by quartering a pixel, and thus the area ratio is set so that imaged regions of a sample corresponding to the first electrode 9 for different incidence angles of light do not overlap each other.

Figure 11A:
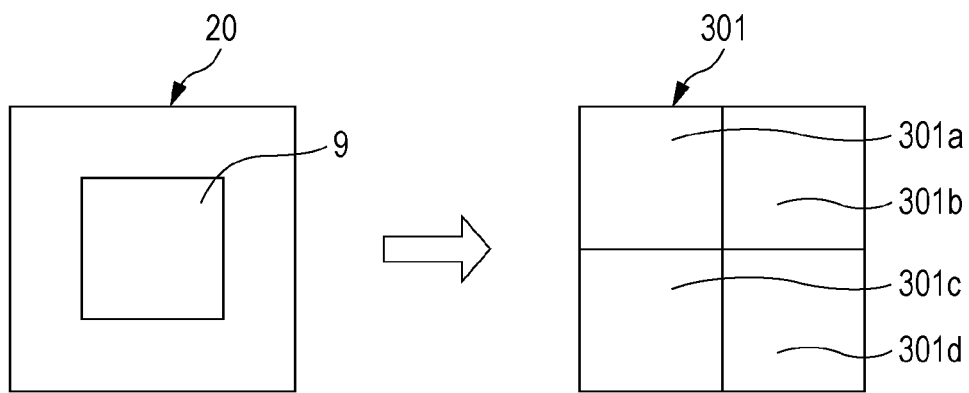
FIG. 11A is a schematic view illustrating a solid-state imaging device including a first electrode with an area ratio of about 25% and imaged regions of a sample which are imaged when rays of light with incidence angles differing from one another are radiated.

Overlaps between imaged regions will be described with reference to FIGS. 11A and 11B. The drawing on the left side of FIG. 11A schematically illustrates a pixel 20 where the area ratio of the first electrode 9 is about 25%. The drawing on the right side of FIG. 11A illustrates imaged regions of the sample 301 when the sample 301 is imaged four times by using rays of light with incidence angles differing from one another. Each of imaged regions 301a to 301d illustrates an imaged region imaged in each time of imaging. As illustrated in FIG. 11A, when the area ratio of the first electrode 9 in the pixel 20 is 25% and the number of imaging operations is four, the imaged regions 301a to 301d do not overlap one another and it is possible to image a sample without leaving any region not imaged.

Figure 11B:
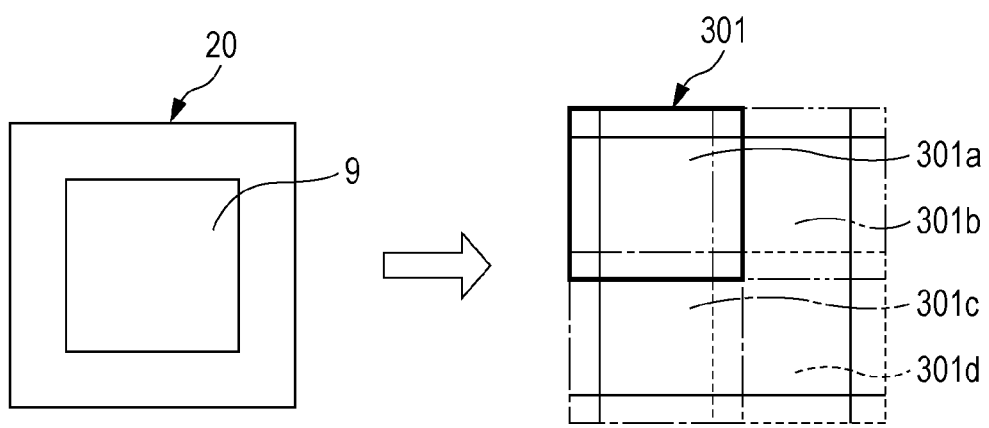
FIG. 11B is a schematic view illustrating a solid-state imaging device including a first electrode with an area ratio of about 33% and imaged regions of the sample which are imaged when rays of light with incidence angles differing from one another are radiated.

On the other hand, the drawing on the left side of FIG. 11B schematically illustrates a pixel 20 where the area ratio of the first electrode 9 is 30%. The drawing on the right side of FIG. 11B illustrates imaged regions of the sample 301 when the sample 301 is imaged four times by using rays of light with incidence angles differing from one another. As illustrated in FIG. 11B, when the area ratio of the first electrode 9 in the pixel 20 is 30% and the number of times of imaging operations is four, portions overlapping one another are generated to the imaged regions 301a to 301d. As described above, increasing the area ratio of the first electrode 9 in the pixel 20 to 30% causes individual imaged regions to overlap one another on some portions and crosstalk to take place between obtained images, as illustrated in FIG. 11B. In consequence, the resolution (in this embodiment, resolution per unit area) is caused to be practically deteriorated. In addition, this crosstalk causes image quality deterioration such as an image blur.

Figure 12:
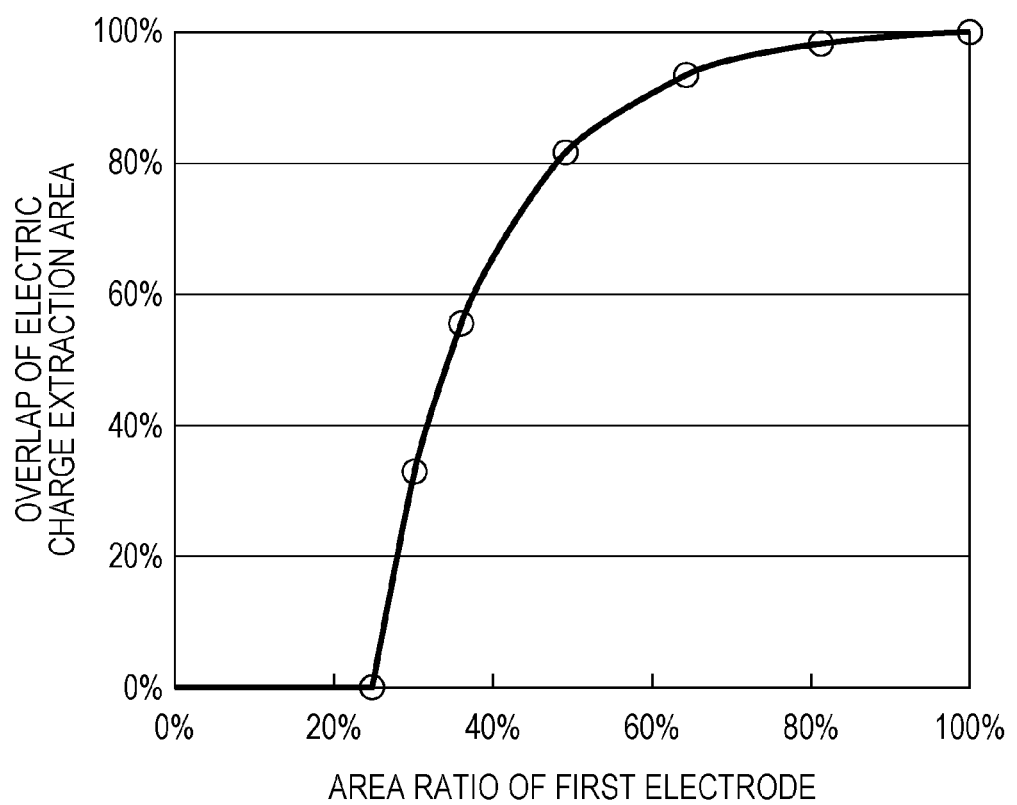
FIG. 12 is a characteristic diagram illustrating a relation between an area ratio of the first electrode in the pixel and a ratio of an area of overlapping portions in the imaged regions to the entire area.

FIG. 12 is a characteristic diagram illustrating a relation between the area ratio of the first electrode 9 in the pixel 20 and a ratio of the area of overlapping portions of imaged regions to the entire area. The "overlap of electric charge extraction area" of the vertical axis means the "ratio of the area of overlapping portions of imaged regions to the entire area". As illustrated in FIG. 12, it is recognized that, when the area ratio of the first electrode 9 surpasses 25%, crosstalk rapidly increases. In this case, in order to reduce image quality deterioration due to crosstalk, it is desirable that the area ratio of the first electrode 9 in the pixel 20 is set at 25% or less.

Although crosstalk does not take place if the area ratio is 25% or less, it does not mean that the smaller the area ratio of the first electrode 9 is, the better the device works. This issue will be described below with reference to FIG. 13.

Figure 13:
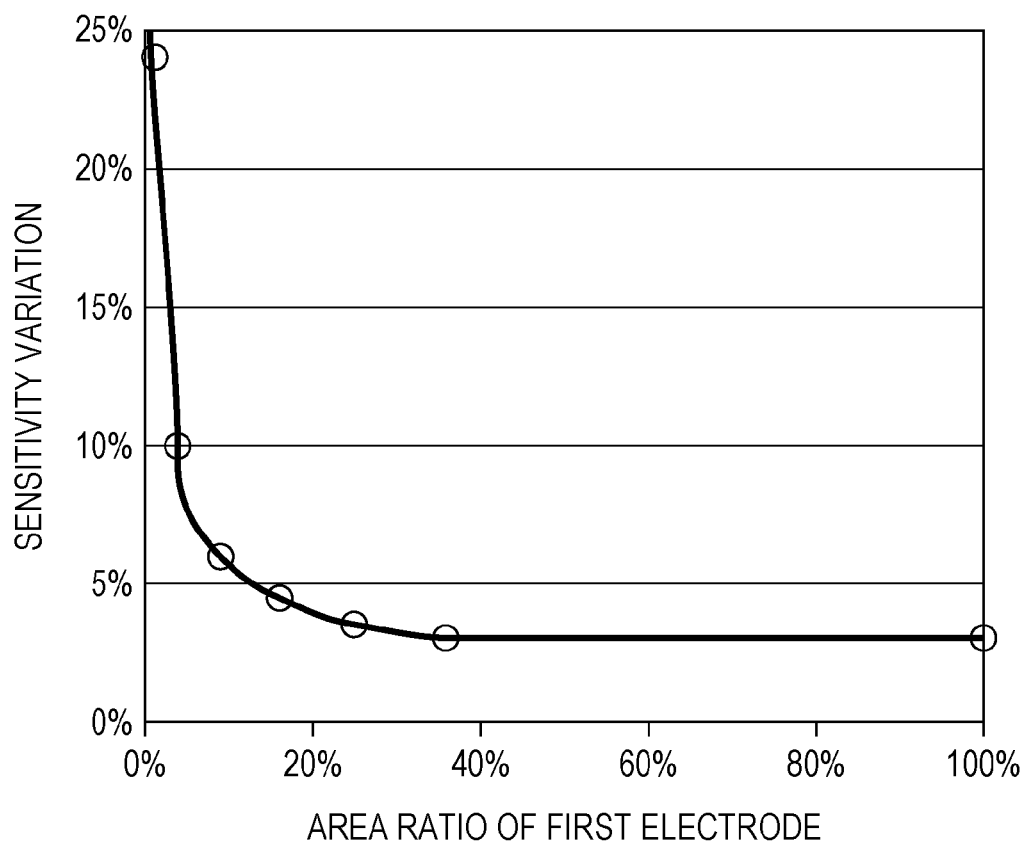
FIG. 13 is a characteristic diagram illustrating a relation between an area ratio of the first electrode in the pixel and a 6σ value of sensitivity variation of the pixel.

FIG. 13 is a characteristic diagram illustrating a relation between the area ratio of the first electrode in a pixel and a 6σ value of sensitivity variation of imaged data. When the area ratio of the first electrode 9 is decreased, the sensitivity variation tends to deteriorate due to variation in quantum efficiency of the organic photoelectric conversion film 11 and processing variation in electrode area. For example, when the pixel size of the solid-state imaging device 100 becomes 1 μm or less, the quantum efficiency becomes susceptible to variation in the number of molecules in the organic photoelectric conversion film 11 corresponding to a first electrode 9. As illustrated in FIG. 13, when the area ratio of the first electrode falls below 5%, the sensitivity variation rapidly deteriorates. Accordingly, it is desirable to set the area ratio of the first electrode at 5% or greater.

Figure 14:
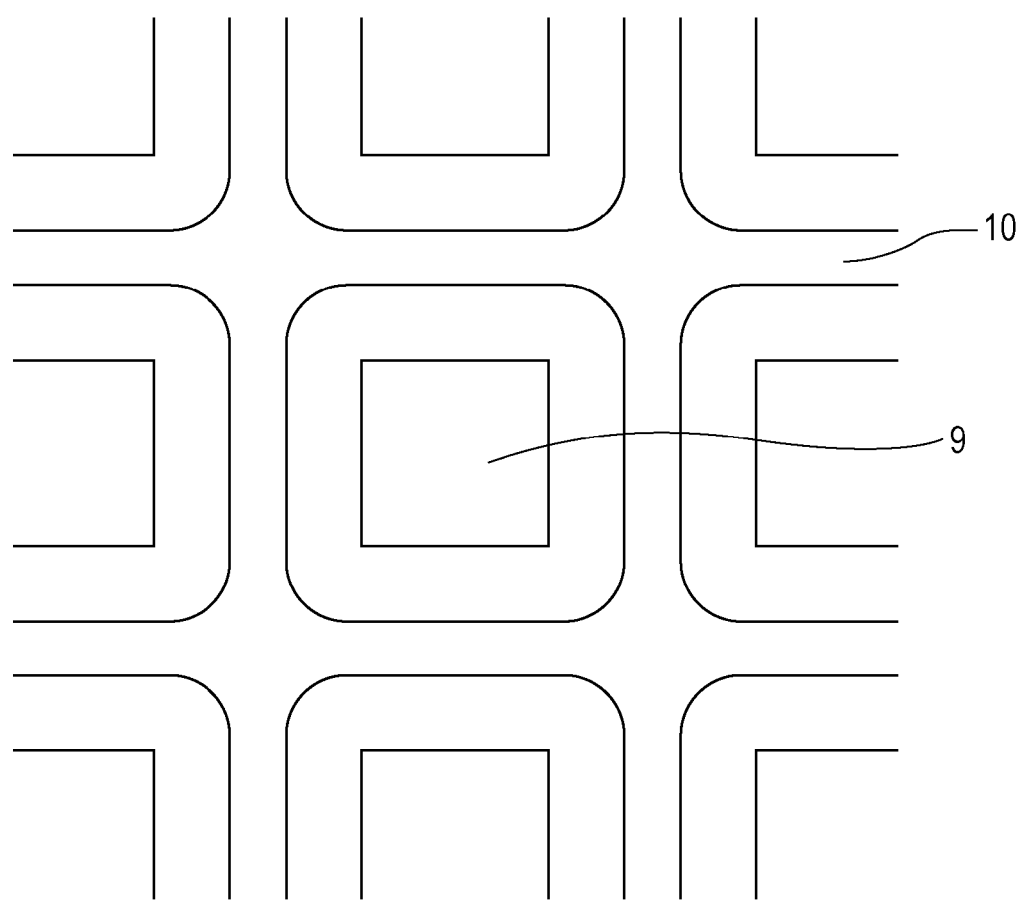
FIG. 14 is a diagram illustrating shapes of the first electrodes and the second electrode.

FIG. 14 is a diagram illustrating shapes of the first electrodes 9 and the second electrode 10. The second electrode 10 has a grid-like shape extending over a plurality of pixels and apertures corresponding to the pixels on a one-to-one basis. The first electrode 9 has a rectangular shape and is formed in an aperture of the second electrode 10. The apertures of the second electrode 10 are rectangular and four corners of each aperture are rounded. As illustrated in FIG. 14, forming the corners of the aperture of the second electrode 10 into rounded shapes makes it possible to rapidly extract electric charges existing between the first electrode 9 and the second electrode 10 into either of these electrodes. More specifically, electric charges generated in the organic photoelectric conversion film 11 are, by an electric field directed toward the first electrode 9 or the second electrode 10, extracted into either of these electrode. However, the electric field is weak around a portion where the organic photoelectric conversion film 11 contacts neither the first electrode 9 nor the second electrode 10 (blanked-out portion in FIG. 14). As a result, though electric charges generated in this portion are extracted through either the first electrode 9 or the second electrode 10, the electric charges move in a slower speed than in a portion where the organic photoelectric conversion film 11 contacts the first electrode 9 or the second electrode 10. Accordingly, in a portion where the organic photoelectric conversion film 11 contacts neither the first electrode 9 nor the second electrode 10, electric charges in the organic photoelectric conversion film 11 are likely to become residual electric charges. These residual electric charges cause noises and an image quality deterioration.

If the corners of the aperture of the second electrode 10 are not rounded but almost right-angled, the distance between a corner of the first electrode 9 and a corner of the aperture of the second electrode 10 becomes longer than the distance between a side of the first electrode 9 and a side of the aperture of the second electrode 10. In this case, an electric field in the organic photoelectric conversion film 11 becomes weaker in a space between the corner of the first electrode 9 and the corner of the aperture of the second electrode 10 than in a space between the side of the first electrode 9 and the side of the aperture of the second electrode 10. Accordingly, shaping the corners of the aperture of the second electrode 10 into rounded shapes makes it possible to reduce residual electric charges in the organic photoelectric conversion film 11 in the blanked-out portion in FIG. 14. In other words, it is possible to equalize amounts of residual electric charges in the organic photoelectric conversion film 11 in the space between the corner of the first electrode 9 and the corner of the aperture of the second electrode 10 and in the space between the side of the first electrode 9 and the side of the aperture of the second electrode 10.

Figure 15:
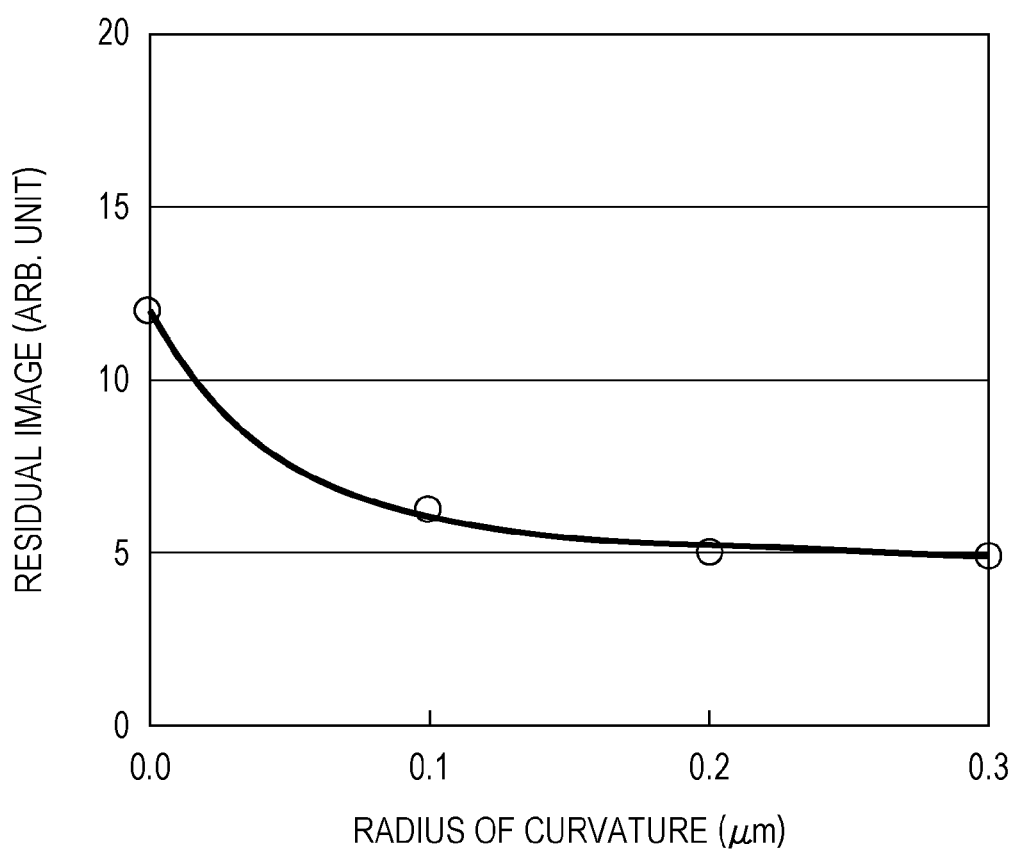
FIG. 15 is a characteristic diagram illustrating a relation between a radius of curvature of corners of the aperture of the second electrode and a residual image which indicates electric charges, left behind after a certain time, to be extracted by the first electrode.
Figure 16:
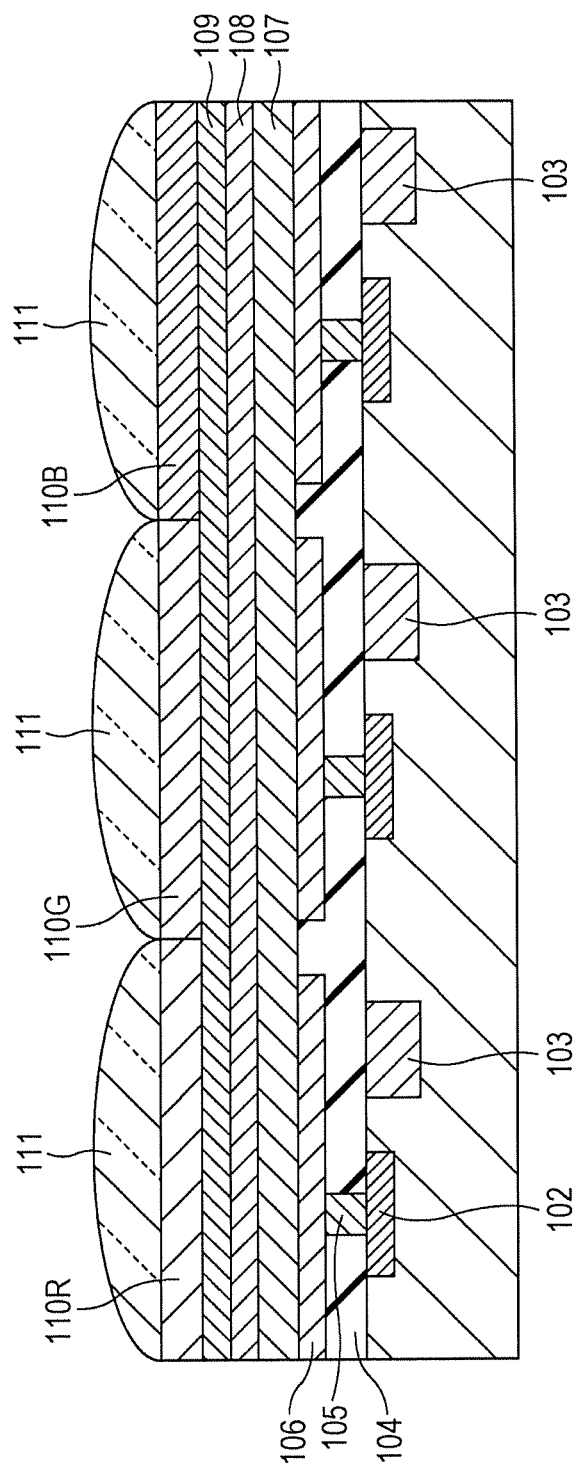
FIG. 16 is a diagram illustrating a cross-sectional structure of a pixel of a layered-type solid-state imaging device according to the related art.

A residual image is one of indices indicating characteristics of an image sensor and a numerically-expressed amount of electric charges which are not extracted within a relevant readout cycle but extracted in the next readout cycle among electric charges generated by photoelectric conversion. FIG. 15 is a characteristic diagram illustrating a relation between the radius of curvature of the corners of the aperture of the second electrode 10 and the above-described residual image. In the horizontal axis, a radius of curvature of 0 μm indicates that the corners of the aperture of the second electrode 10 have right angles. Other values indicate that the corners of the aperture of the second electrode 10 are rounded as illustrated in FIG. 14. As illustrated in FIG. 15, making the corners of the aperture of the second electrode 10 have a large radius of curvature causes the distance between the first electrode 9 and the second electrode 10 at this position to be shortened, making it possible to decrease the residual image. For example, in a case of a pixel size of 1 μm or less, it is desirable that the corners of the aperture of the second electrode 10 have a radius of curvature of 0.1 μm or greater.

As described above, according to the solid-state imaging device 100 of this embodiment, because the total area ratio of the first electrode 9 and the second electrode 10 in the pixel 20 is 40% or greater, it is possible to reduce or prevent peeling of the organic photoelectric conversion film 11. Furthermore, the solid-state imaging device 100 of this embodiment has an advantageous effect that, because an aperture ratio (that is, the area ratio of the first electrode 9 in the pixel 20) is set at a small value of 25% or less, it is possible to use the super resolution technology effectively.

A solid-state imaging device of the present disclosure includes pixels arranged two-dimensionally, each pixel of the pixels including: a first electrode; a second electrode located in a same layer as the first electrode, the second electrode being located such that the first electrode included in one of the pixels is caused to be separated from the first electrode included in each of the pixels adjacent to the one of the pixels; an organic photoelectric conversion film including a first surface and a second surface, the first surface being opposite to the second surface, the first surface being in contact with the first electrode and the second electrode; and a counter electrode located on the second surface. The organic photoelectric conversion film extends over the pixels. The first electrode is an electrode through which electrons or holes generated in the organic photoelectric conversion film are extracted. The second electrode extends over the pixels. The second electrode includes an aperture which corresponds to the each pixel of the pixels. The first electrode is located in the aperture. The aperture has a rectangular shape with round corners. The first electrode has a rectangular shape. With this configuration, it is possible to decrease residual images.

In the above configuration, a pitch between the pixels may be 1 μm or less, and the radius of curvature of each of the corners of the aperture may be 0.1 μm or greater.

An imaging module of the present disclosure includes a base material and the above-described solid-state imaging device, the solid-state imaging device being mounted on the base material.

An imaging apparatus of the present disclosure includes the above-described imaging module.

In FIGS. 8A to 10 and FIGS. 11A and 11B, an operation example in which a high resolution image is obtained by carrying out super-resolution by use of four low resolution images was described. However, it is only necessary for the number of low resolution images to be 2 or greater, and thus the number of low resolution images may be, for example, 9 or 16.

Although a case in which the solid-state imaging device 100 is used for medical contact imaging was described, uses of the solid-state imaging device 100 are not limited to this use. The solid-state imaging device 100 may also be used for a digital still camera, a video camera, or the like.

Although exemplary embodiments were described above, claims of the present disclosure are not limited to these embodiments. Without departing from new teachings and benefits on the subjects described in the attached claims, various modifications may be applied in each of the above-described embodiments, and it will be easily understood by those skilled in the art that other embodiments may be devised by arbitrarily combining components of the above-described embodiments. Accordingly, such variations and other embodiments are included in the scope of the present disclosure.

The present disclosure has a so high industrial value that application thereof is indispensable to implement super resolution on a layered-type image sensor using an organic photoelectric conversion film.

What is claimed is:

1. A solid-state imaging device, comprising pixels arranged two-dimensionally, each pixel of the pixels including:
   a first electrode;
   a second electrode located in a same layer as the first electrode, the second electrode being located such that the first electrode included in one of the pixels is caused to be separated from the first electrode included in each of the pixels adjacent to the one of the pixels;
   an organic photoelectric conversion film including a first surface and a second surface, the first surface being opposite to the second surface, the first surface being in contact with the first electrode and the second electrode; and
   a counter electrode located on the second surface, wherein the organic photoelectric conversion film extends over the pixels, the first electrode is an electrode through which electrons or holes generated in the organic photoelectric conversion film are extracted, an area ratio of the first electrode to the each pixel is 25% or less, and a total area ratio of a sum of the first electrode and the second electrode to the each pixel is 40% or greater.

2. The solid-state imaging device according to claim 1, wherein a pixel pitch of the pixels is 1 µm or less.

3. The solid-state imaging device according to claim 1, wherein the area ratio of the first electrode to the each pixel is 5% or greater.

4. The solid-state imaging device according to claim 1, wherein the second electrode surrounds the first electrode.

5. The solid-state imaging device according to claim 1, wherein the second electrode extends over the pixels, the second electrode includes an aperture which corresponds to the each pixel of the pixels, and the first electrode is located in the aperture.

6. The solid-state imaging device according to claim 5, wherein the aperture has a rectangular shape with round corners, and the first electrode has a rectangular shape.

7. The solid-state imaging device according to claim 6, wherein a pixel pitch of the pixels is 1 µm or less, and each of the round corners has a radius of curvature of 0.1 µm or greater.

8. The solid-state imaging device according to claim 1, wherein the second electrode includes discrete electrodes which surround the first electrode, the discrete electrodes being electrically insulated from each other.

9. The solid-state imaging device according to claim 1, wherein the second electrode has a function different from a function of the first electrode.

10. The solid-state imaging device according to claim 1, the each pixel of the pixels further including an insulating film, the insulating film including at least one of a silicon oxide and a silicon nitride, wherein the insulating film is located such that the first electrode included in the one of the pixels is caused to be electrically insulated from the first electrode included in each of the pixels adjacent to the one of the pixels.

11. The solid-state imaging device according to claim 1, wherein the organic photoelectric conversion film includes at least one of an electron blocking layer containing an electron donating organic material and a hole blocking layer containing an electron accepting organic material.

12. An imaging module comprising:

a base material; and the solid-state imaging device according to claim 1, the solid-state imaging device being mounted on the base material.

13. An imaging apparatus comprising:

the imaging module according to claim 12.

* * * * *